United States Patent
Kobayashi et al.

(10) Patent No.: US 6,559,879 B1
(45) Date of Patent: May 6, 2003

(54) LED ARRAY HEAD, CIRCUIT BOARD, AND LED ARRAY CHIP

(75) Inventors: Yu Kobayashi, Tokyo (JP); Norio Nakajima, Tokyo (JP); Takatoku Shimizu, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 09/449,500

(22) Filed: Nov. 29, 1999

(30) Foreign Application Priority Data

Dec. 11, 1998 (JP) ............................................ 10/352802

(51) Int. Cl.⁷ .............................. B41J 2/45; B41J 2/385
(52) U.S. Cl. ........................................ 347/238; 347/130
(58) Field of Search ................................ 347/238, 245, 347/263, 130, 233; 29/832, 843, 623.4; 428/428; 361/736, 747, 779, 760, 764, 761; 257/673; 523/428; 174/261

(56) References Cited

U.S. PATENT DOCUMENTS

| | | | | |
|---|---|---|---|---|
| 4,524,372 A | * | 6/1985 | De Cock et al. ............ 347/238 |
| 4,774,634 A | * | 9/1988 | Tate et al. .................... 361/760 |
| 4,821,051 A | * | 4/1989 | Hediger ....................... 347/130 |
| 4,866,108 A | * | 9/1989 | Vachon et al. .............. 523/428 |
| 5,177,500 A | * | 1/1993 | Ng .............................. 347/245 |
| 5,261,156 A | * | 11/1993 | Mase et al. .................... 29/832 |
| 5,617,131 A | * | 4/1997 | Murano et al. ............. 347/233 |
| 5,670,826 A | * | 9/1997 | Bessho et al. .............. 257/737 |
| 5,780,162 A | * | 7/1998 | Toyoda et al. .............. 428/428 |
| 6,108,210 A | * | 8/2000 | Chung ......................... 361/747 |
| 6,281,450 B1 | * | 8/2001 | Urasaki et al. ............. 174/261 |

FOREIGN PATENT DOCUMENTS

EP        0 892 027 A1 * 1/1999 ............. C09J/9/00

* cited by examiner

Primary Examiner—Hai Pham
(74) Attorney, Agent, or Firm—Rabin & Berdo, P.C.

(57) ABSTRACT

An LED array head includes a circuit board and a plurality of LED array chips mounted thereon. Each of the plurality of LED array chips has a plurality of light-emitting elements aligned and exposed on a surface thereof. The plurality of LED array chips are aligned on the circuit board in a direction in which the plurality of light-emitting elements are aligned, so that the plurality of light-emitting elements lie on a single straight line. The LED array chips are bonded to the circuit board by an epoxy resin type soft adhesive.

8 Claims, 11 Drawing Sheets

LED ARRAY HEAD, CIRCUIT BOARD, AND LED ARRAY CHIP

BACKGROUND OF THE INVENTION

1. Field of the Invention

The present invention relates to an LED array head and a circuit board, and LED array chips that form the LED array head, whereby the LED array head is used as a light source for writing an electrostatic latent image on a photoconductive drum in an electrophotographic printer.

2. Description of the Related Art

With a conventional electrophotographic printer, a charging roller charges the surface of a photoconductive drum and an exposing unit such as an LED head writes an electrostatic latent image on the charged surface of the photoconductive drum. The LED array head emits light through a focusing rod lens array to illuminate the charged surface in accordance with print data. The electrostatic latent image is developed with toner into a toner image, which is subsequently transferred to a print medium. The toner image on the print medium is then fixed by a fixing unit.

FIG. 8 illustrates a general construction of an electrophotographic printer.

Referring to FIG. 8, there is provided a photoconductive drum 1 surrounded by a charging roller 2, an LED array head 3, a focusing rod lens 4, a developing roller 5, and a transfer roller 7. Arrows indicate directions of rotation of the structural elements. The developing roller 5 applies toner to the electrostatic latent image on the photoconductive drum to develop the electrostatic latent image into a toner image. The transfer roller 7 transfers the toner image from the photoconductive drum 1 to a print medium 100. A supply roller 6 rotates in contact with the developing roller 5 to supply toner to the developing roller 5. A fixing device 101 fixes the toner image transferred to the print medium 100.

The conventional LED array head 3 will be described in detail.

FIG. 9A is a perspective view illustrating the general construction of the LED array head 3 when the driver chips 10 are arranged on one side of the row of the LED array chips 9.

The circuit board 8 has conductive pattern i.e., wiring pattern formed thereon. Each of the LED array chips 9 has a plurality of light-emitting diodes fabricated therein. Driver chips 10 are connected to the corresponding LED array chips 9 through wires 11, and drives the LED array chips 9. The driver chips 10 are also connected to the circuit board 8 through wires 12.

The driver chips 10 may be arranged on both sides of the row of the LED array chips 9 as shown in FIG. 9B.

FIGS. 10A and 10B illustrate the construction of the conventional LED array head 3, FIG. 10A being a top view and FIG. 10B being a cross-sectional view taken along lines 10B—10B.

FIG. 11 is a perspective view showing the structure of the conventional LED array chip 9.

Referring to FIGS. 10A, 10B, and 11, the LED array chip 9 has light-emitting elements 13 and individual electrodes 14a formed thereon. The individual electrode pads 14b are formed on the LED array chip 9 by using the same material as the individual electrodes 14a. The individual electrode pads 14b and drive electrode pads 15 are provided for wire bonding. The LED array chip 9 has common electrode 23 formed on the underside thereof.

Each of driver chips 10 is formed with drive electrode pads 15 thereon. Signal inputting and outputting pads 16 are formed on the driver chips 10 for wire bonding. The LED array chips 9 and driver chips 10 are bonded on the circuit board 8 by an adhesive 28 that contains conductive particles therein. The circuit board is formed with conductive pattern 17 thereon.

The circuit board 8 takes the form of a glass epoxy board with copper conductive pattern 17 formed thereon. The driver chip 10 is formed on a silicon substrate, and the LED array chip 9 is formed on a compound semiconductor in which gallium arsenide phosphide is grown on a gallium arsenide substrate by epitaxy. The common electrode 23 formed on the bottom side of the LED array chip 9 is formed of gold or gold alloy. Wires 11 and 12 are gold.

The circuit board 8 carries as many LED array chips as there are driver chips 10. The LED array chips 9 are connected to the driver chips 10 by using as many wires 11 as there are light-emitting elements. For example, if an image is to be printed with a resolution of 600 dpi on A4 size paper, 26 LED array chips 9 and 26 driver chips 10 are required to be mounted on the circuit board 8. Each LED array chip 9 has 192 light-emitting elements aligned at intervals of 42.3 $\mu$m and 192 wires 11 are used to connect individual electrode pads on the LED array chip 9 to corresponding drive electrode pads on the driver chips 10.

The common electrodes 23 on the LED array chips 9 are electrically connected to the conductive pattern 17 on the circuit board 8 by means of an adhesive 28 containing conductive particles. The adhesive 28 is a thermosetting epoxy resin type adhesive. Once the adhesive 28 sets, the conductive particles are sandwiched between the common electrode 23 and the conductive pattern 17, thereby establishing electrical continuity therebetween.

The driver chips 10 are fixedly mounted on the circuit board 8 using an insulating epoxy resin type adhesive. The signal inputting and outputting pads 16 of the driver chips 10 are connected to corresponding conductive pattern (wiring pattern), not shown, on the circuit board 8. The driver chips 10 receive electrical signal and drive the corresponding LED array chips 9 in accordance with the electrical signal, thereby selectively causing the light-emitting elements 13 to emit light.

The assembly operation of the LED array head 3 will be described.

First, the adhesive 28 is applied to the conductive pattern 17 formed on the circuit board and then the LED array chips 9 are mounted on the conductive pattern 17 using the die-bonding apparatus. Then, the insulating epoxy resin type adhesive is applied to predetermined areas of the circuit board 8 where the driver chips 10 are to be mounted, and then the driver chips 10 are mounted thereon.

The light-emitting elements are arranged at intervals of 42.3 $\mu$m for the resolution of 600 dpi. For good print results, adjacent LED array chips 9 must be positioned such that the distance L2 between the endmost light-emitting elements of adjacent LED chips is exactly the same as the distance L1 between adjacent light-emitting elements within the adjacent LED array chips. The distance L1 is closely controlled to be 42.3 $\mu$m. Using the die-bonding apparatus, the LED array chips 9 are positioned with respect to the alignment patterns such that the distance L2 is accurately 42.3 $\mu$m.

After having the LED array chips 9 and driver chips 10 bonded thereon, the circuit board 8 is placed in an oven. The circuit board is heated at 150° C. in the oven, so that the adhesive 28 sets to fix the LED array chips 9 and driver chips 10 in position. Then, the circuit board 8 is taken out of the oven and is cooled. The conductive particles contained in the adhesive 28 has a diameter of several microns. Heating the adhesive 28 causes the conductive particles to be coupled to one another, thereby making the electrical connection between the LED array chips 9 and the circuit board 8.

After the die-bonding of the chips, individual electrode pads of the LED array chips 9 are wire-bonded to the corresponding drive electrode pads of the driver chips 10. The signal inputting and outputting pads 16 of the driver chips 10 are wire-bonded to the conductive pattern 17 formed on the circuit board 8. This completes the assembly of the LED array head 3.

The thus assembled conventional LED array head 3 presents the following problem.

When the adhesive 28 is cooled down after the heating process, the dimension K of the LED array chip 9 in the direction in which the light-emitting elements are aligned becomes shorter. This is due to the fact that the adhesive 28 shrinks and there is a difference in thermal expansion between the LED array chip 9 and circuit board 8.

FIG. 12 illustrates the shrinkage of the LED array chip 9 when the adhesive sets.

The dimension K of the LED array chip 9 is K=Ka and the light-emitting elements are aligned at intervals of L1=L1a (=Ka/192).

Using the adhesive 28, a plurality of LED array chips 9 are mounted on the circuit board 8 such that the distance L2 between endmost light-emitting elements of adjacent LED chips is L2a. When the circuit board 8 is heated, the circuit board 8 expands more than the LED array chip 9 and the LED array chip 9 is bonded on the thermally expanded board 8. When the circuit board 8 is cooled down, the circuit board 8 shrinks to the original size. As the circuit board 8 shrinks, the LED array chip 9 is subjected to a shrinking stress such that the dimension K shrinks by $\Delta K$ to K=Kb=Ka−$\Delta K$. This causes the distance L2 to become longer by $\Delta K$ to L2=L2b= L2a+$\Delta K$. In other words, each of the adjacent LED array chips shrinks such that the opposing longitudinal ends of the LED array chip 9 shrinks by $\Delta K/2$ toward the center of the LED array chip. Therefore, the distance L2 becomes longer by $2(\Delta K/2)=\Delta K$. The distance L1 becomes shorter by $\Delta K/191$ so that the dimension L1=L1a−($\Delta K/191$).

The LED array chip 9 having 192 light-emitting elements designed for 600 dpi has the dimension Ka of 8.1 mm before the adhesive sets. Therefore, the shrinkage $\Delta K$ is about 4 $\mu$m, which represents about 9% of the desired distance L=42.3 $\mu$m between adjacent light-emitting elements. After the adhesive has set, the distance L2 increases to about 46.3 $\mu$m. If the distance L2 becomes too longer than a desired value L, white thin lines appear in the print results.

White lines that appear in the print result will be described with reference to FIGS. 13 and 14.

FIG. 13 illustrates odd-numbered light-emitting elements being energized and even-numbered light-emitting elements not being energized when the LED array chip has expanded such that light-emitting elements are aligned at intervals of L2=L+$\Delta K$.

FIG. 14 illustrates a printed pattern of lines and spaces when a printing is performed using the LED array head energized as shown in FIG. 13.

Referring to FIG. 14, a width LN of each line is constant and a width S of each space is also constant. A space S+$\Delta K$, which corresponds to the distance between endmost light-emitting elements of adjacent chips, is wider than the space S. It is to be noted that the white area is larger in the region corresponding to the distance L2 than in the other regions corresponding to the distance L1. The larger white areas result in white lines in the printed results.

FIG. 15 illustrates, the relationship between the probability of occurrence of white lines and the ratio $\Delta K/L$, where L is a desired distance L2 between the adjacent light-emitting elements of adjacent chips and $\Delta K$ is a deviation or increase from the desired distance L.

A printing is performed by using a plurality of LED array heads which have the same distance L1 (=42.3 $\mu$m) but different distance L2. Then, a plurality of persons inspect the printed patterns. The probability of occurrence of white lines is defined by the ratio of the number of persons who found white lines to the total number of persons. The results shown in FIG. 15 reveal that white lines are noticed when the expansion (inter-chip space) $\Delta K/L$ exceeds 0.08 or 8% depending on the characteristics of the printer under test.

As mentioned above, with the conventional LED array head, white lines can appear due to increased distances L2 between endmost light-emitting elements of adjacent LED array chips.

The adhesive not applied evenly or the LED array chips not sufficiently pressed against the circuit board 8 causes increases in the distance between the common electrode 23 of the LED array chip 9 and the conductive pattern formed on the circuit board 8. This in turn causes poor electrical contact between the common electrode 23 and the conductive pattern 17, sometimes the electrical contact being completely lost. Moreover, poor electrical contact may occur some time after the LED array head has passed the testing.

SUMMARY OF THE INVENTION

The present invention was made in view of the above-described problems with the conventional art.

An object of the invention is to reduce the shrinkage of the LED array chips after the adhesive has set, thereby improving the print quality.

Another object of the invention is to ensure the electrical continuity between the common electrodes of the LED array chips and the conductive pattern formed on the circuit board, thereby improving reliability of the LED array head.

An LED array head comprises a circuit board and a plurality of LED array chips bonded thereon. Each of the plurality of LED array chips has a plurality of light-emitting elements aligned and exposed on a surface of the LED array chip. The plurality of LED array chips are aligned on the circuit board in a direction in which the plurality of light-emitting elements are aligned such that the light-emitting elements lie on a single straight line. The LED array chips are bonded by an epoxy resin type soft adhesive to the circuit board.

Each of the plurality of LED array chips has a common electrode that is connected to all of the light-emitting elements. The common electrode is electrically connected through the soft adhesive to the conductive pattern formed on the circuit. The conductive pattern may include bumps and dips. The soft adhesive contains conductive particles therein.

Alternatively, the common electrode may have bumps and dips formed thereon.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

The present invention will be described in detail with reference to the accompanying drawings.

First Embodiment

A first embodiment is characterized in that LED array chips are mounted on a circuit board using a soft adhesive having flexibility (i.e., the coefficient of elasticity of the adhesive is small).

Figure 1A:
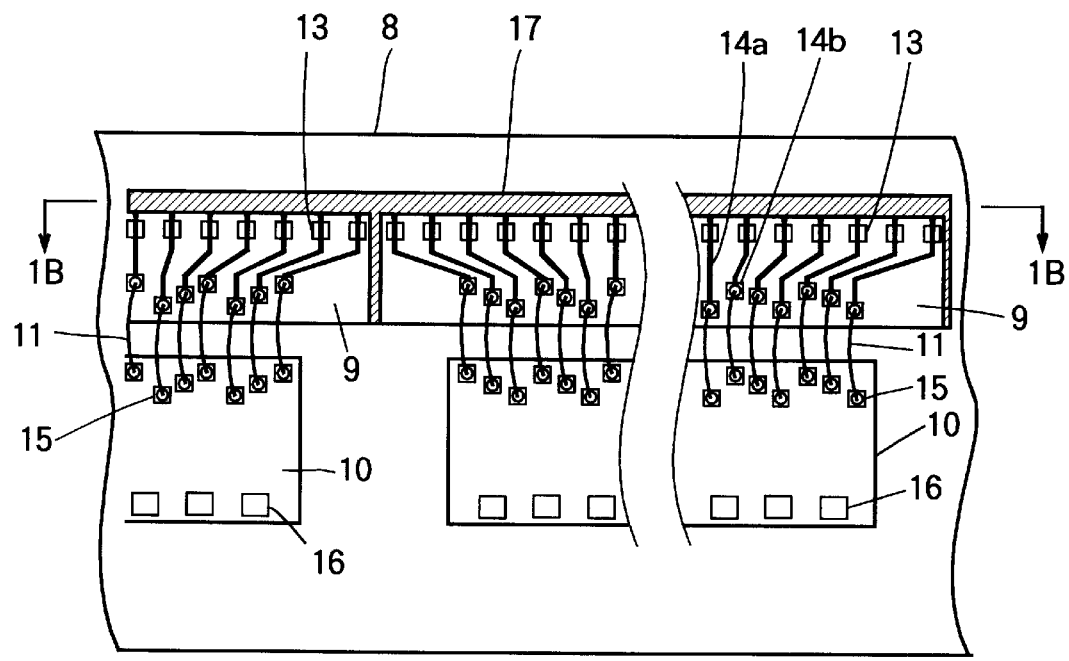
FIG. 1A is a top view of an LED array head according to the first embodiment.

FIG. 1A is a top view of an LED array head according to the first embodiment.

Figure 1B:
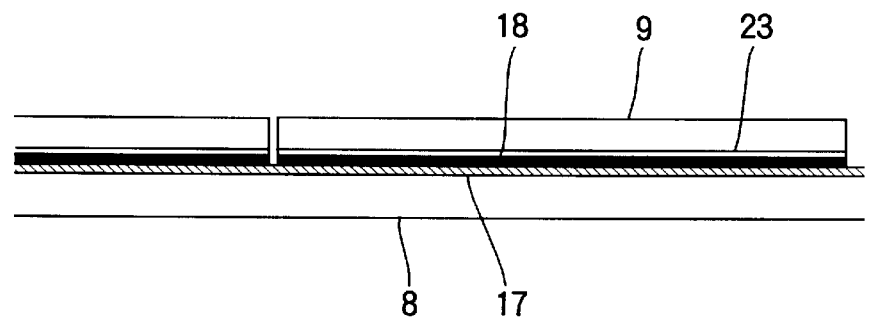
FIG. 1B is a cross-sectional view taken along lines 1B—1B of FIG. 1A.

FIG. 1B is a cross-sectional view taken along lines 1B—1B of FIG. 1A.

The LED array head includes LED array chips 9, driver chips 10, and circuit board 8. The circuit board 8 supports a plurality of LED array chips 9 and a plurality of driver chips 10 thereon. Each of the LED array chips 9 has a row of a plurality of light-emitting elements 13 fabricated therein. The plurality of LED array chips 9 are aligned in a row such that the light-emitting elements of all the LED array chips 9 lie on a single line. The driver chips 10 are aligned on one side of the row of the plurality of LED array chips 9. Each of the driver chips 10 drives light-emitting elements 13 of a corresponding LED array chip 9.

The LED array head according to the first embodiment is used as an LED array head for printing an image on an A4 size print medium with a resolution of 600 dpi.

On the front surface of the LED array chip 9, there are provided 192 light-emitting elements 13 aligned in the row at intervals of 42.3 μm, and individual electrodes 14a and individual electrode pads 14b that connect to corresponding anodes of the light-emitting elements 13. On the bottom surface of the LED array chip 9, there is provided a common electrode 23 that are electrically commonly connected to the cathodes of all the light-emitting elements 13 in the LED array chip 9. The LED array chip 9 is formed of a compound semiconductor in which gallium-arsenide-phosphide layer is grown on a gallium-arsenide substrate by epitaxy. The light-emitting elements 13 are a pn junction formed in this compound semiconductor. The individual electrodes 14a are continuous with the individual electrode pads 14b. The individual electrodes 14a and individual electrode pads 14b are an aluminum electrode or an aluminum alloy electrode. The common electrode 23 is a gold electrode or a gold alloy electrode.

On the front surface of the LED array chip 9, there are provided 192 drive electrode pads 15 and a plurality of signal inputting and outputting pads 16. The LED array chip 9 also includes shift registers, latches, and drive circuits, not shown. The driver chip 10 is fabricated on a silicon substrate and supplies currents to corresponding light-emitting elements 13 through the drive electrode pads 15, thereby selectively energizing the 192 light-emitting elements 13 of the LED array chip 9 in accordance with print data and light-emission controlling signals (clock, load, strobe etc.).

The circuit board 8 has a conductive pattern 17 to which the common electrode 23 of the LED array chip 9 is connected. The circuit board 8 also has a wiring pattern through which print data, light-emission controlling signals, supply voltage etc. are supplied to the driver chips 10. The circuit board 8 is in the form of a glass epoxy board. The conductive pattern 17 and the wiring patterns are, for example, copper patterns.

The individual electrode pads 14b are connected to corresponding drive electrode pads 15 through bonding wires 11. Therefore, the 192 individual electrode pads 14b of the LED array chip 9 are connected to the corresponding 192 drive electrode pads of the driver chip 10 through the 192 wires 11. The bonding wires 11 are, for example, gold wires. The signal inputting and outputting pads 16 are wire-bonded to the wiring patterns formed on the circuit board 8.

The common electrode 23 of the LED array chip is bonded to the conductive pattern by a soft adhesive that contains conductive particles therein. The conductive particles contact the common electrode 23 and the conductive pattern 17 to make electrical connection therebetween. The driver chips 10 are mounted on the circuit board 8 by an insulating epoxy resin type adhesive.

A soft adhesive 18 is a thermosetting epoxy resin type adhesive which has added flexibility.

Processes for adding flexibility to an epoxy resin type adhesive include:

(1) Formulating a flexible epoxy resin
(2) Using a flexible curing agent
(3) Formulating a flexibilizer The flexible epoxy resin includes dimer acid diglycidyl ester (manufactured by Shell chemical Co. and sold under trade name of Epikote 871, 872), bisphenol side chain type epoxy resin (manufactured by ASAHI DENKA KOGYO and sold under trade name of ADEKA resin EP 4000), and polyoxyalkylene glicol_diglycidyl ether (DER 732, 736 manufactured by the Dow Chemical Company).

The flexible curing agent includes polyamide of dimer acid and superfluous diamine, EH631 and EH651, Epomate (manufactured by Ajinomoto), and dodecenyl succinic anhydride.

The flexibilizer for acid anhydride curing includes polyester and polyoxyalkyleneglicol having hydroxyl group at the ends thereof and the flexible curing agent for amine setting includes polysulfide (e.g., Thiokol LP-3) having a thiol group.

Other agents that serve both as a flexibilizer and a reactive diluent include glycidyl ester of tertiary fatty acid glycidyl ester (manufactured by Shell Chemical Company) and glycidyl ether of alkylphenol.

The conductive particles that are mixed into the soft adhesive 18 is, for example, particles of silver, gold, platinum, palladium, nickel, or copper.

The assembly of the LED array head according to the first embodiment will be described.

The soft adhesive 18 is evenly applied to the conductive pattern 17 formed on the circuit board 8, and the LED array chips 9 are mounted on the soft adhesive using a die-bonding apparatus. The die-bonding apparatus presses the LED array chips 9 against the circuit board 8 to adjust the positions of the LED array chips 9 with respect to alignment patterns such that the distance between the endmost light-emitting elements of adjacent chips is equal to the distance (=42.3 μm) between adjacent light-emitting elements within the LED array chip. An insulating epoxy resin type adhesive is applied to predetermined areas and then the driver chips 10 are mounted thereon.

The circuit board 8 having the LED array chips 9 and driver chips 10 mounted thereon is placed into an oven where the circuit board 8 is heated to 150° C. so that the soft adhesive 18 and insulating adhesive are cured. Thus, the LED array chips 9 and driver chips 10 are fixed on the circuit board 8. Thereafter, the circuit board 8 is taken out of the oven.

After bonding the LED array chips 9, the individual electrode pads 14b are wired-bonded to the drive electrode pads 15 of the driver chips 10, and the signal inputting and outputting pads 16 of the driver chips 10 are wire-bonded to the wiring patterns on the circuit board 8. This completes the assembly of the LED array head.

The light-emitting operation will now be described. A total of 26 shift registers of the driver chips 10 are connected in cascade. The cascaded shift registers receive 4992 (=192× 26) bits of print data, each bit being transferred sequentially through the shift register upon a clock signal. Then, upon receiving a load signal, the print data held in the shift registers is loaded into the latch circuit. Then, upon a strobe signal, the drive circuit supplies drive currents to light-emitting elements corresponding to "High level" of the latched data, thereby driving the light-emitting elements to emit light.

When an external force is applied to an object, the object undergoes strain $\epsilon$ in shape and volume. Then, a stress $\sigma$ is developed in the object, acting to restore the original shape and volume of the object. The stress $\sigma$ is given by $\sigma = E \times \epsilon$, where E is a coefficient of elasticity of the object. In other words, if the stress $\sigma$ is to be small, the coefficient of elasticity should be small. The softer the object is, the smaller the coefficient of elasticity E is.

Figure 10A:
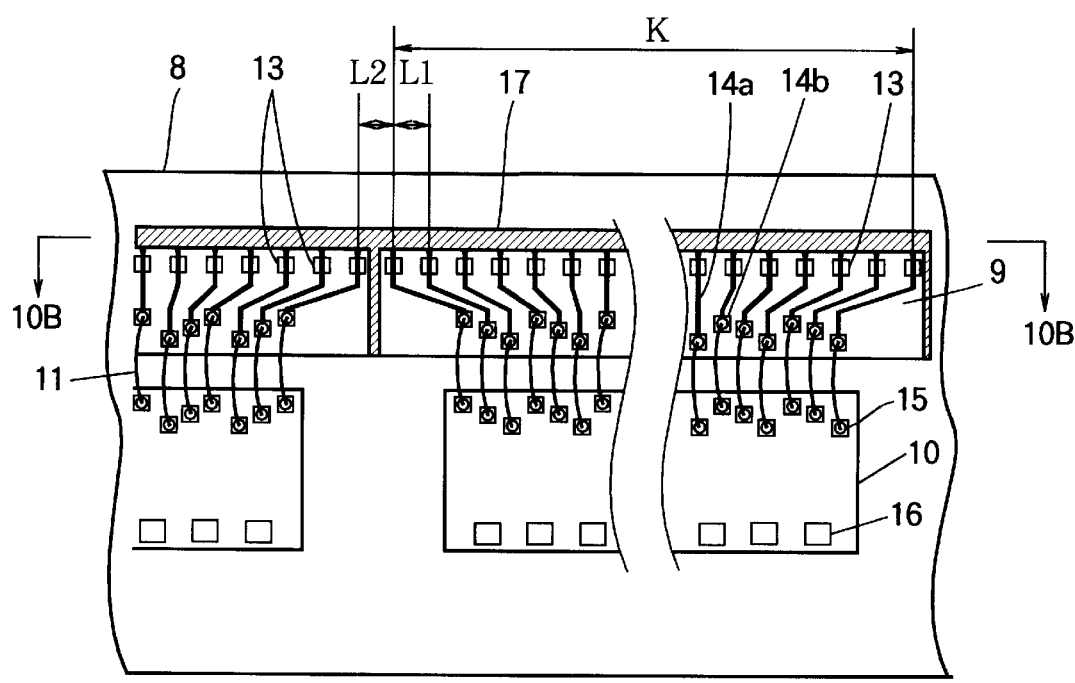
FIGS. 10A and 10B illustrate the construction of a conventional LED array head, FIG. 10A being a top view and FIG. 10B being a cross-sectional view taken along lines 10B—10B of FIG. 10A.
Figure 10B:
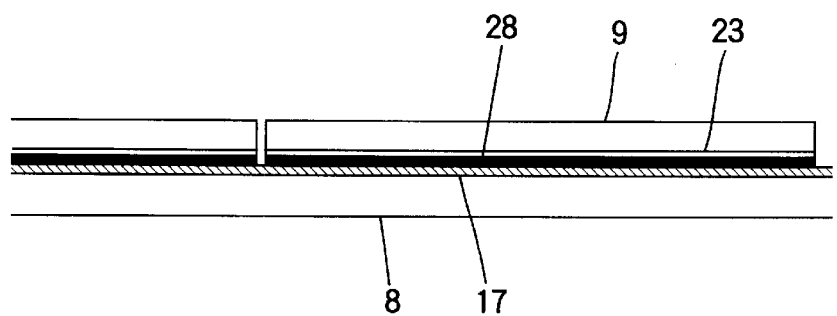

The LED head according to the first embodiment uses a soft adhesive 18. Once the soft adhesive 18 has cured, it has flexibility and a smaller coefficient of elasticity than the conventional adhesive 28 (FIG. 10B), so that less shrinking stress is developed within the cured adhesive 18. Thus, the soft adhesive 18 serves as a buffer and does not transmit a large shrinking stress from the circuit board 8 to the LED array chip 9. Thus, the LED array chip 9 of the first embodiment undergoes less shrinkage as compared to the conventional LED array head.

Figure 2A:
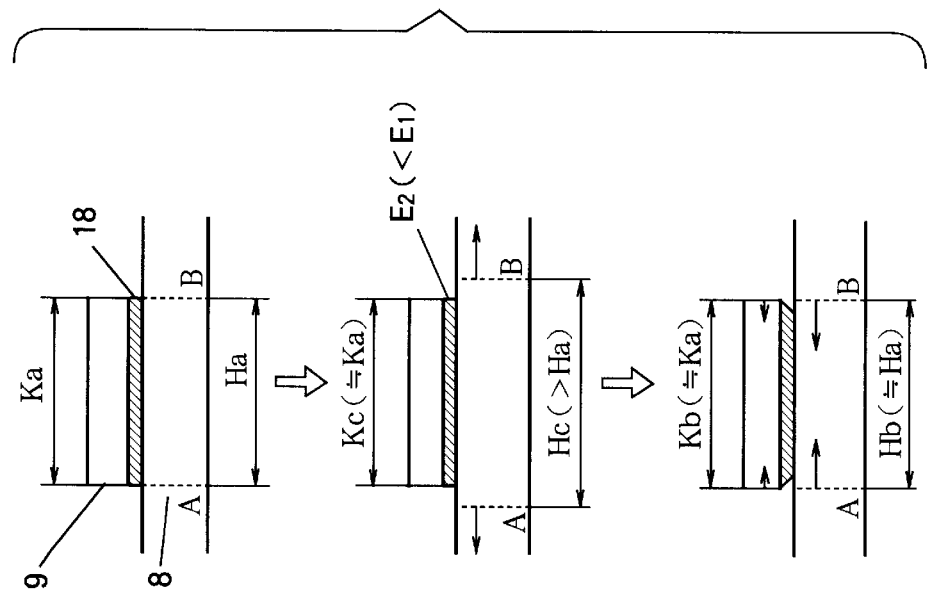
FIG. 2A illustrates the die-bonding process of the conventional art.
Figure 2B:
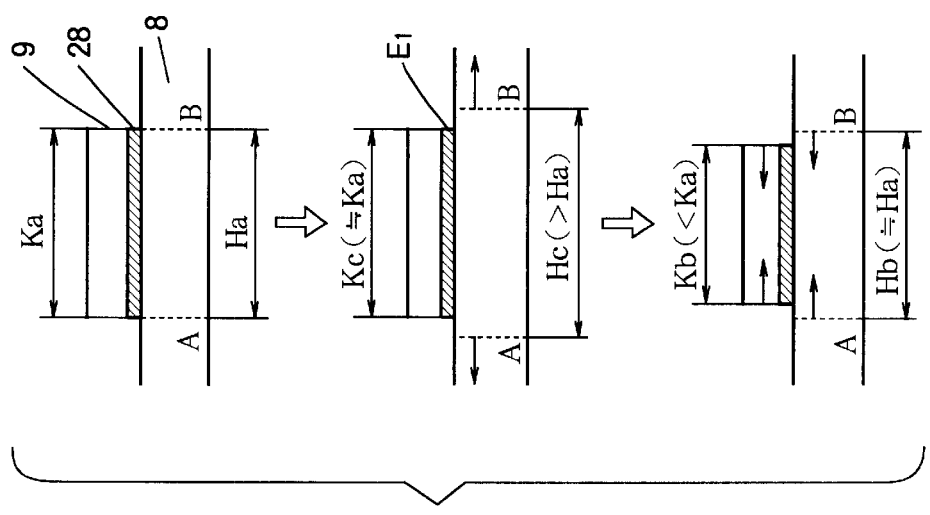
FIG. 2B illustrates the die-bonding process of the first embodiment.

FIGS. 2A and 2B compare the shrinkage of the LED array chip according to the first embodiment with that of the LED array chip according to the conventional LED array head. FIG. 2A illustrates the die-bonding process of the conventional art and FIG. 2B illustrates the die-bonding process of the first embodiment.

FIGS. 2A and 2B show the following dimensions.

Ka: The length of the LED array chip 9 before the adhesive has cured

Ha: The length of the chip-mounting area on the circuit board 8 before the adhesive has cured Kc: The length of the LED array chip while the adhesive is being cured Hc: The length of the chip-mounting area on the circuit board 8 while the adhesive is being cured Kb: The length of the LED array chip after the adhesive has cured (after cooling)

Hb: The length of the chip-mounting area on the circuit board 8 after the adhesive has cured (after cooling)

E1: The coefficient of elasticity of the adhesive 28 after it has cured

E2: The coefficient of elasticity of the soft adhesive 18 after it has cured, E2 being smaller than E1.

The adhesive 28 (FIG. 2A) and soft adhesive 18 (FIG. 2B) are applied to the circuit boards 8, and the LED array chips 9 are placed on the adhesives 28 and 18. When the circuit boards 8 are heated, the LED array chips 9 undergoes little or no expansion but the circuit boards 8 expand significantly so that Kc≈Ka and Hc>Ha. The LED array chips 9 are actually bonded to the thermally expanded circuit board 8.

When the circuit boards 8 are cooled, the circuit boards 8 shrink (Hb≈Ha). The shrinking stress of the circuit boards 8 is transmitted to the adhesives 28 and 18 so that the adhesives 28 and 18 shrink (FIG. 2C). Since the adhesive 28 has no flexibility, the shrinking stress is directly transmitted to the LED array chip 9 and the LED chip 9 shrinks so that Kb<Ka. However, the soft adhesive 18 used in the first embodiment has a smaller coefficient of elasticity than the adhesive 28 and has flexibility as opposed to the adhesive 28 used in the conventional LED array head. Thus, less shrinking stress is transmitted from the circuit board 8 to the LED array chip 9, so that the shrinkage of the LED chip 9 in the present invention is smaller than in the conventional art, i.e., Kb≈Ka.

Figure 3:
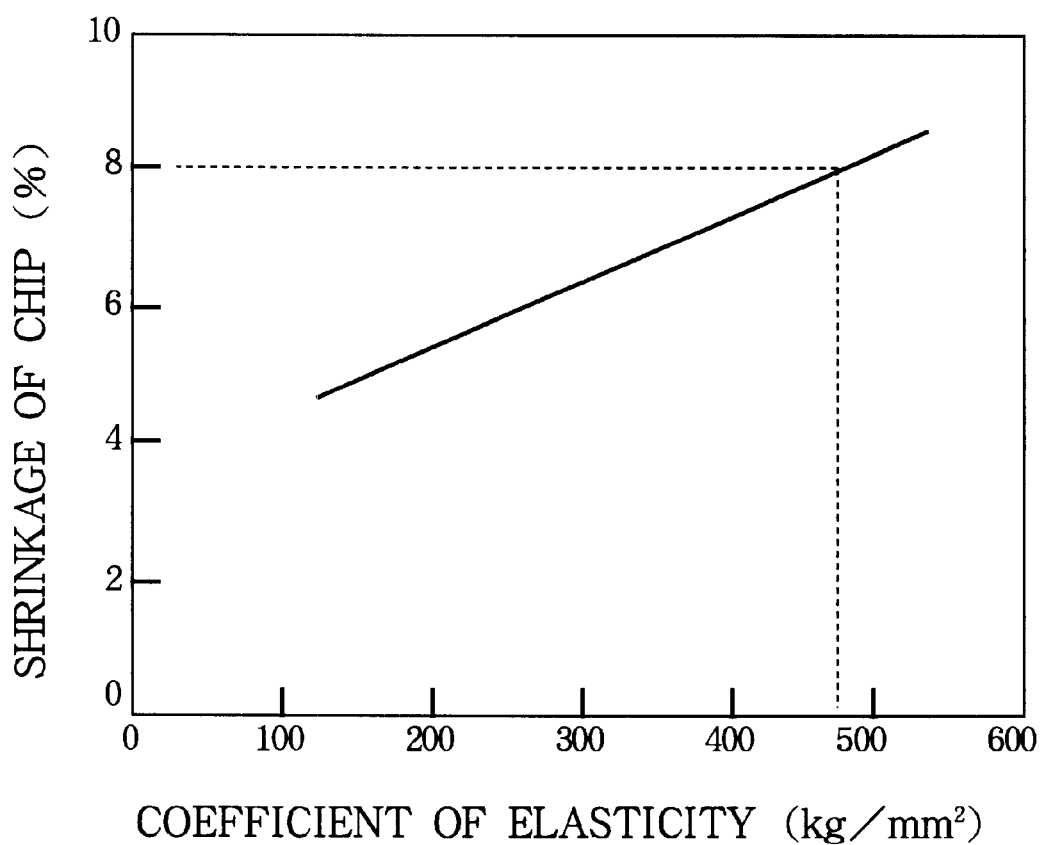
FIG. 3 illustrates the relationship between the coefficient of elasticity of the soft adhesive 18 and the coefficient of shrinkage of the LED array chip 9.

FIG. 3 illustrates the relationship between the coefficient of elasticity of the soft adhesive 18 and the coefficient of shrinkage of the LED array chip 9.

Figure 15:
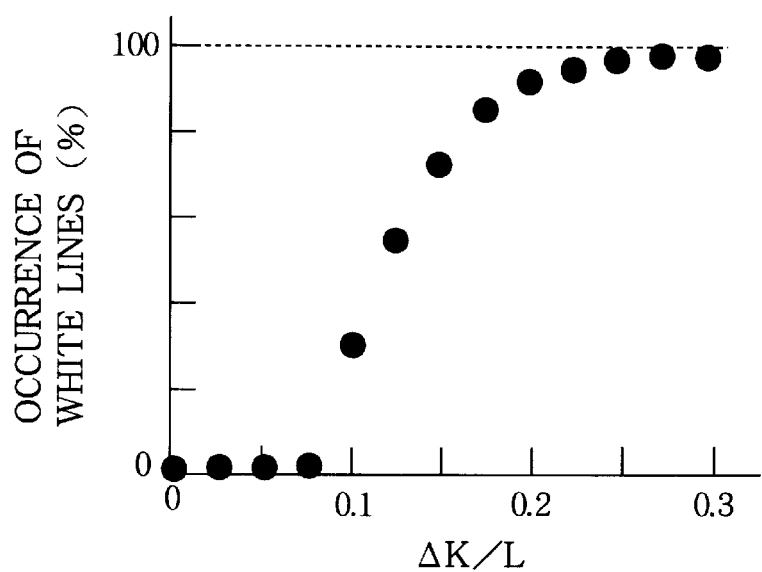
FIG. 15 illustrates the relationship between occurrence of white lines and ratio ΔK/L of the conventional LED array head, where L is a desired distance between the adjacent light-emitting elements of adjacent chips and ΔK is a deviation or expansion from the desired distance L.

Referring to FIG. 3, the coefficient of shrinkage of the LED array chip is a ratio $\Delta K/L$ of the shrinkage $\Delta K$ to the distance L (=42.3 μm) between adjacent light-emitting elements. Coefficients of shrinkage larger than 8% tends to cause white liens in the print results as described with reference to FIG. 15. As is clear from FIG. 3, using the soft adhesive 18 having a coefficient of elasticity of less than 470 kg/mm$^2$ can reduce the coefficient of chip shrinkage to a value less than 8%, which does not cause white liens in the print results.

Second Embodiment

Just as in the first embodiment, the LED array chips of a second embodiment are also die-bonded on the circuit board using a soft adhesive having a small coefficient of elasticity. The second embodiment is also characterized in that the conductive pattern formed on the circuit board have uneven surfaces, a soft adhesive containing conductive particles therein is applied to the uneven surfaces, and then the LED array chips are mounted on the adhesive.

Figure 4A:
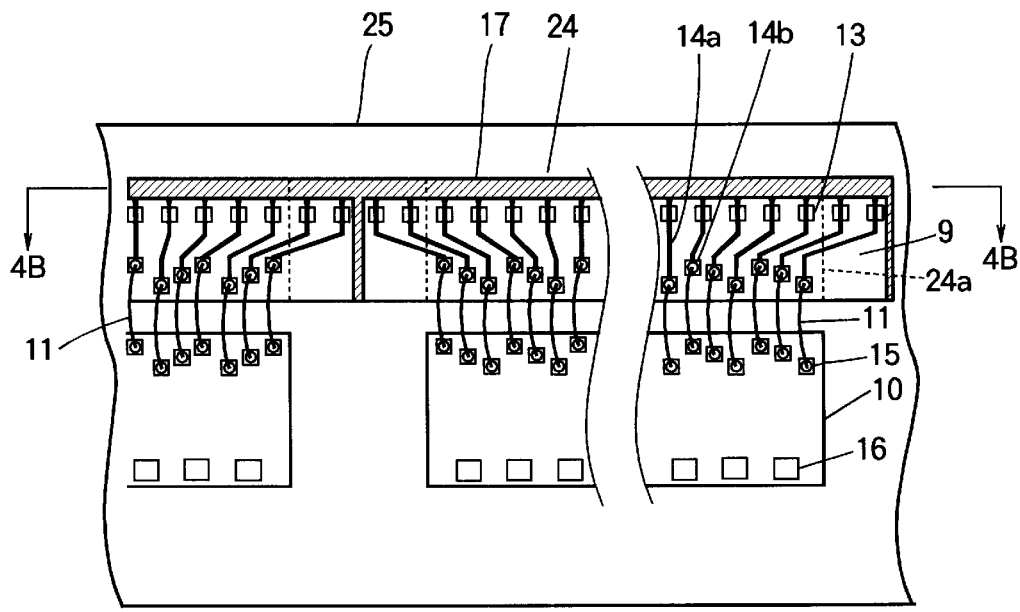
FIG. 4A is a top view of an LED array head according to the first embodiment.

FIG. 4A is a top view of an LED array head according to the first embodiment.

Figure 4B:
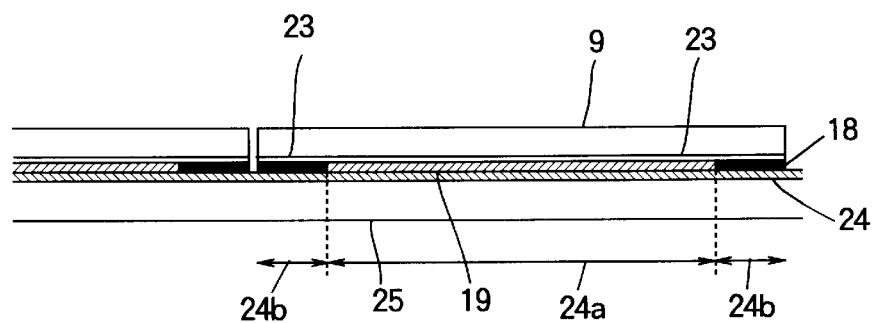
FIG. 4B is a cross-sectional view taken along lines 4B—4B of FIG. 4A.

FIG. 4B is a cross-sectional view taken along lines 4B—4B of FIG. 4A.

Elements shown in FIGS. 4A and 4B have been given the same reference numerals as FIG. 1. In the second embodiment, a circuit board 25 is used in place of the circuit board 8. The LED array head of the second embodiment is assembled in the same process as the first embodiment.

Figure 5A:
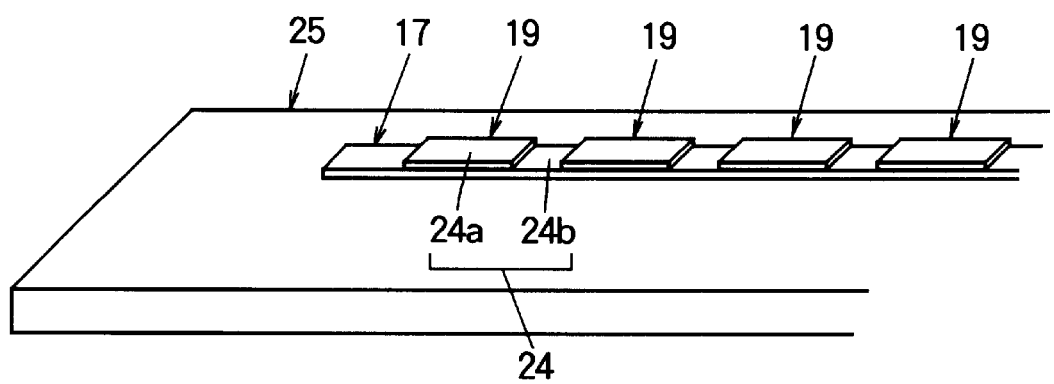
FIG. 5A is a perspective view of the circuit board for the LED array head of the second embodiment.

FIG. 5A is a perspective view of the circuit board 25 for the LED array head of the second embodiment shown in FIGS. 4A and 4B. The circuit board 25 differs from the circuit board 8 of the first embodiment in that the conductive pattern 17 have uneven surfaces rather than flat surfaces.

Referring to FIG. 5A, the flat circuit board 25 has the flat conductive pattern 17 formed thereon. Then, a conductive pattern 24 having conductive bumps 24a and dips 24b are formed on the flat conductive pattern 17.

Figure 5B:
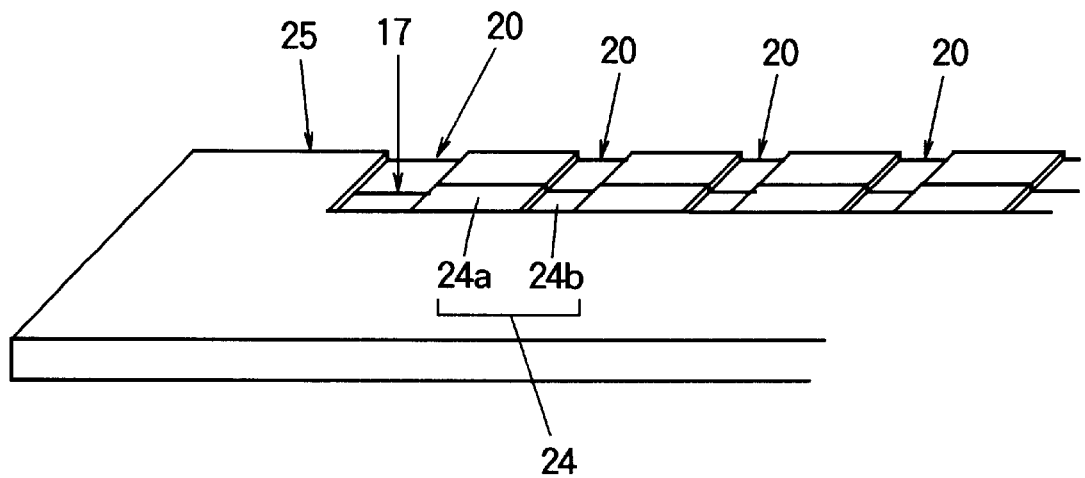
FIG. 5B is a perspective view of a modification of the circuit board 25.

FIG. 5B is a perspective view of a modification of the circuit board 25.

As shown in FIG. 5B, instead of forming a flat conductive pattern 17, the surface of the circuit board 25 may be etched or cut to form uneven surface and then the conductive pattern 17 are formed on the uneven surface so that the uneven conductive pattern 24 is formed. In FIG. 5B, bumps 24a is flush with the surface of the circuit board.

The mounting area of each LED array chip 9 on the circuit board 25 includes two dips 24b and a bump 24a between the two dips 24b. Thus, the LED array chip 9 is mounted by die-bonding such that the common electrode 23 of the LED array chip 9 sits on the bump 24a. The common LED array chip 9 extends over the two dips 24b to cover them by an equal area such that all of the individual electrode pads 14b are positioned over the bump 24a.

When the LED array chip 9 is die-bonded on the conductive pattern 24, the dips 24b receive the excessive soft adhesive 18 applied on the conductive pattern 24, so that the distance between the common electrode 23 and the conductive pattern 17 is substantially the same across the entire length of the LED array chip. This ensures that the conductive particles contained in the soft adhesive 18 contact the bump 24a and the common electrode 23 to make good electrical contact therebetween.

Because all of the individual electrode pads 14b of the die-bonded LED array chip 9 are positioned over the bump 24a, the reliable bonding of the individual electrode pads 14b can be performed by ultrasonic wire bonding.

While only one bump 24a is provided in the chip-mounting area for each LED array chip, a plurality of bumps may be provided. While the LED array chip 9 was positioned such that all the individual electrode pads 14b are over the bumps 24a, the LED array chip 9 may be positioned such that some of the individual electrode pads 14b are over the dip 24b, provided that reliable wire-bonding can be carried out. The shape and size of the bum 24a are not limited to those shown in FIGS. 5A and 5B but may be selected as desired.

Third Embodiment

Just as in the first embodiment, the LED array chips of a second embodiment are also die-bonded on the circuit board using a soft adhesive having a small coefficient of elasticity. The third embodiment is also characterized in that the surface of the common electrode of the LED array chip has bumps and dips and the LED array chip is die-bonded with a soft adhesive applied between the uneven surface of the common electrode of the LED array chip and the conductive pattern formed on the circuit board.

Figure 6A:
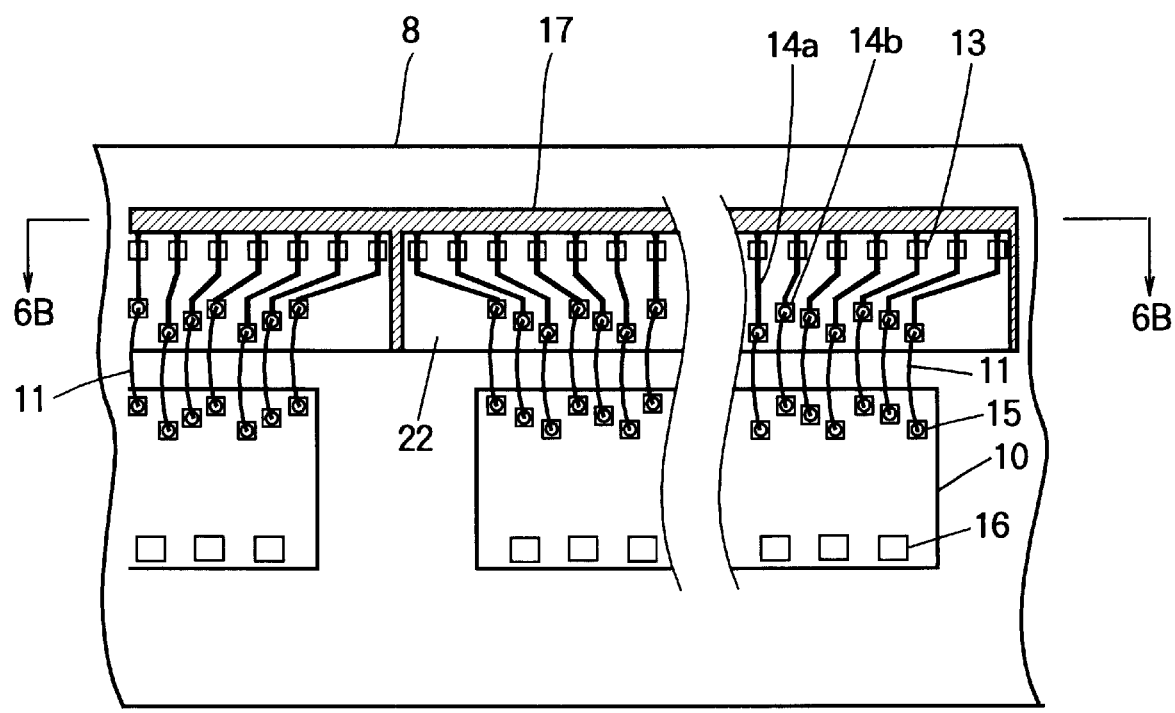
FIGS. 6A and 6B illustrate an LED array head according to the third embodiment, FIG. 6A being a top view and FIG. 6B being a cross-sectional view taken along lines 6B—6B of FIG. 6A.
Figure 6B:
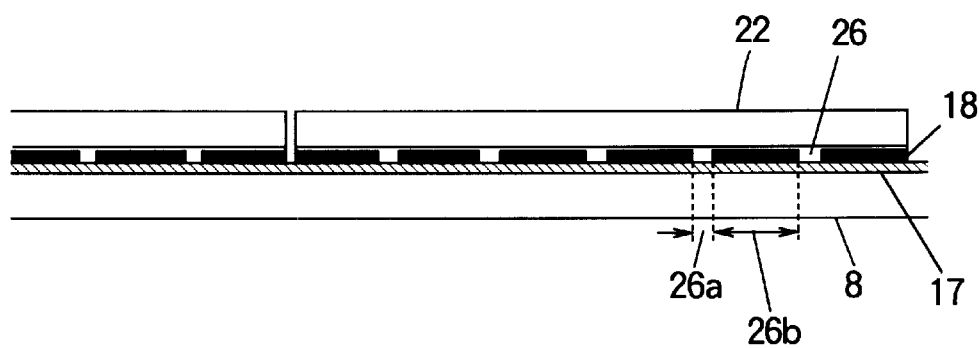

FIGS. 6A and 6B illustrate an LED array head according to the third embodiment. FIG. 6A is a top view and FIG. 6B is a cross-sectional view taken along lines 6B—6B of FIG. 6A. Elements similar to those of FIG. 1 have been given the same reference numerals. The third embodiment differs from the first embodiment in that an LED array chip 22 is used in place of the LED array chip 9. The LED array head of the third embodiment is assembled in the same process as the first embodiment.

Figure 7:
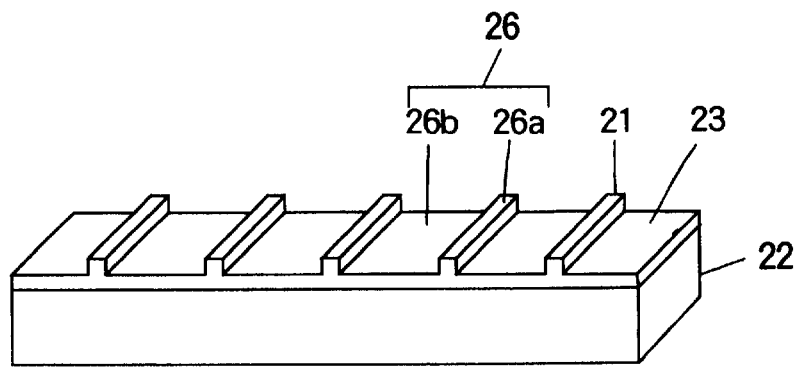
FIG. 7 is a perspective view of an LED array chip 22 of the third embodiment, showing the bottom side of the LED array chip.
Figure 8:
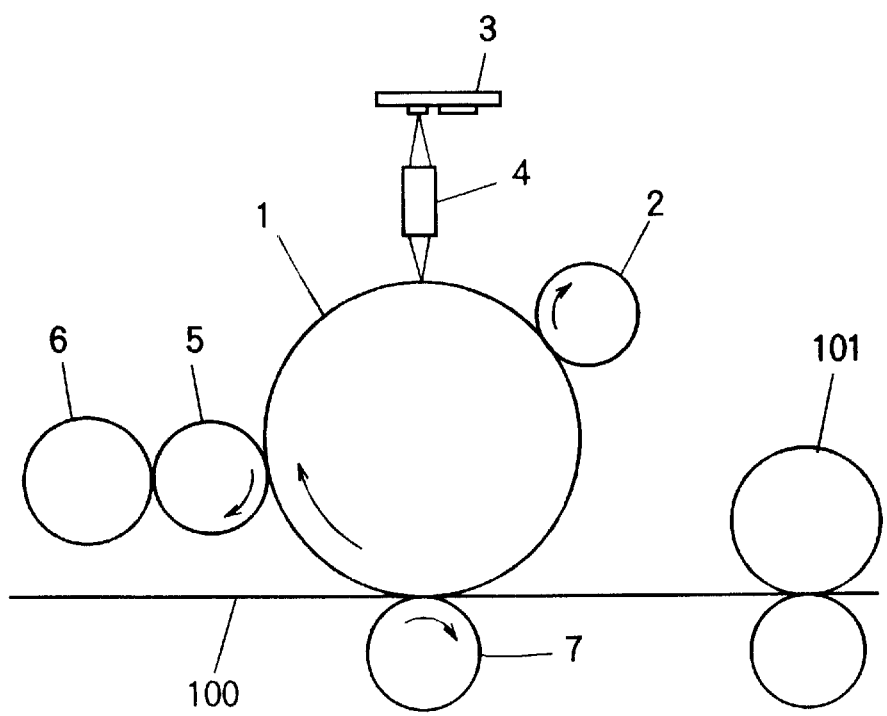
FIG. 8 illustrates a general construction of an electrophotographic printer.
Figure 9A:
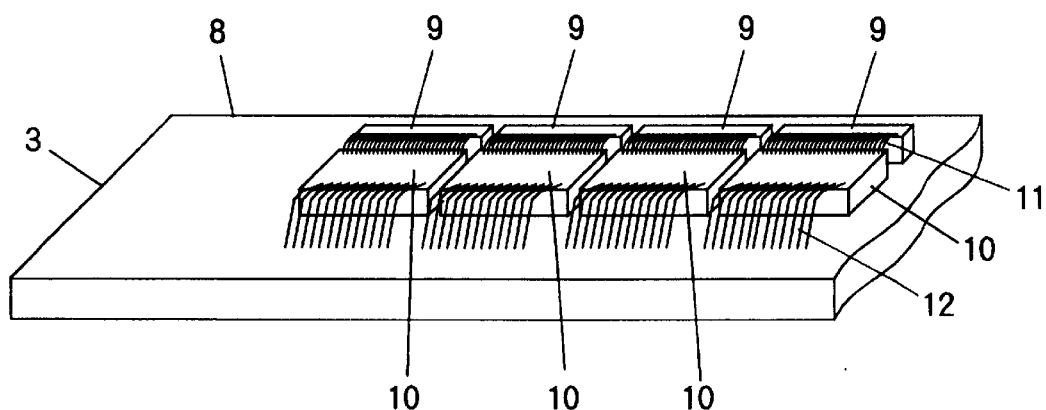
FIG. 9A illustrates driver chips of an LED array head when they are arranged on one side of the row of the LED array chips.
Figure 9B:
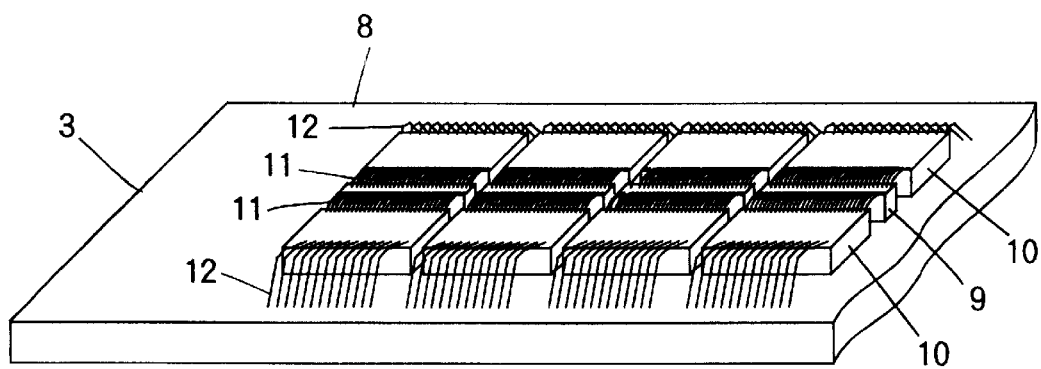
FIG. 9B illustrates the driver chips of the LED array head when they are arranged on both sides of the row of the LED array chips.

FIG. 7 is a perspective view of an LED array chip 22 of the third embodiment, showing the bottom side of the LED array chip.

Figure 11:
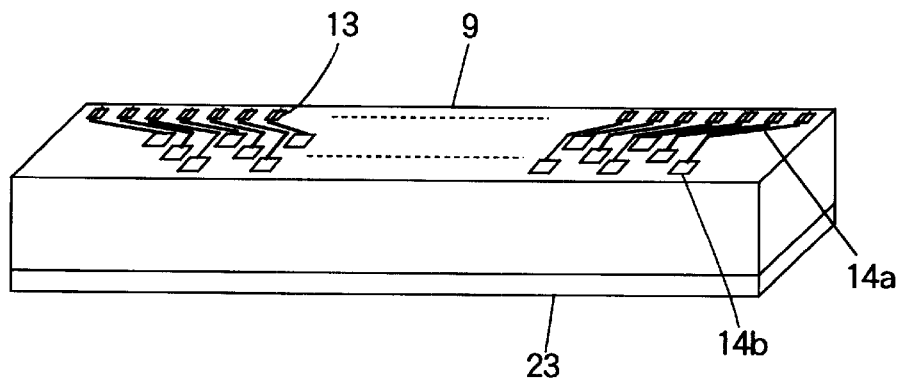
FIG. 11 is a perspective view showing the structure of the conventional LED array chip.
Figure 12:
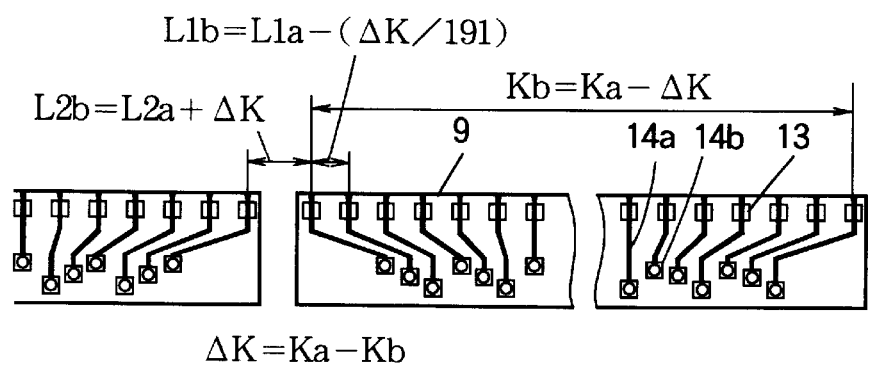
FIG. 12 illustrates the shrinkage of the LED array chip of the conventional LED array head when the adhesive is being set.
Figure 13:
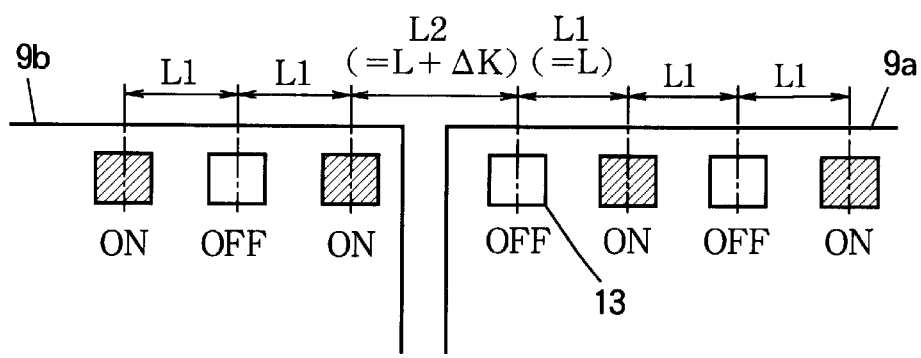
FIG. 13 illustrates light-emitting elements of the conventional LED array head, aligned at intervals of L2=L+ΔK, odd-numbered elements being energized and even-numbered elements being not energized.
Figure 14:
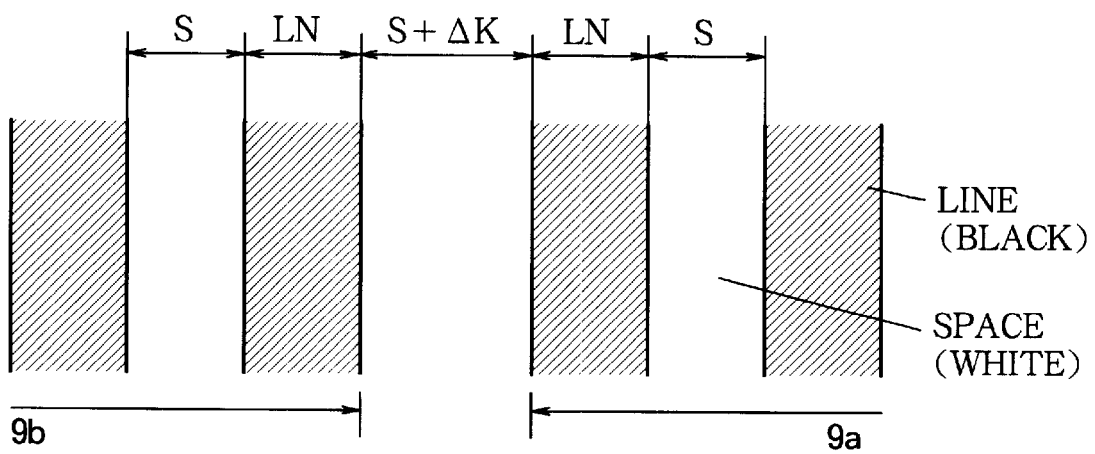
FIG. 14 illustrates a printed pattern of lines and spaces when a printing is performed using the LED array head energized as shown in FIG. 13.

The LED array chip 22 is a modification of the LED array chip 9 shown in FIGS. 1 and 11, and is characterized in that the common electrode 26 having an uneven surface is used in place of the common electrode 23 having a flat surface.

The LED array chip 22 has the flat common electrode 23 on the bottom side of the LED array chip 22. Projections of gold or gold alloy are formed on the flat common electrode 23 by lift-off technique, thereby providing an uneven common electrode 26 having bumps 26a and dips 26b. Alternatively, the flat surface of the common electrode 23 may be half-etched into an uneven surface, thereby providing an uneven common electrode 26. A plurality of bumps 26a are formed at predetermined intervals in a direction in which the light-emitting elements are aligned.

When the LED array chip 22 is placed on the soft adhesive 18 applied to the conductive pattern 17 on the circuit board 8, an excessive amount of the soft adhesive 18 is received in the dips 26b. Thus, the distance between the common electrode 23 and the conductive pattern 17 is substantially the same across the entire length of the LED chip 22. This ensures that the conductive particles contained in thee soft adhesive 18 contact the bumps 26a of the common electrode 23 and the conductive pattern 17 to make good electrical contact therebetween.

The shape, size, and number of bumps 26a are not limited to those shown in FIG. 7 but can be selected according to specific design requirements. If the bumps 26a are positioned under the individual electrode pads 14b, the ultrasonic wire bonding process can be carried out more reliably.

The first to third embodiments have been described with respect to an LED array head in which the driver chips 10 are arranged on one side of the row of LED array chips. The present invention is equally applicable to an LED array head in which the driver chips are aligned on both sides of the row of the LED array chips.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An LED array head, comprising:
    a circuit board a base material of which forms a glass epoxy board having a conductive pattern formed thereon; and
    a plurality of LED array chips, including a compound semiconductor having gallium and arsenide therein, wherein
        each of said LED array chips has a plurality of light-emitting elements aligned and exposed on an upper surface thereof and has a common electrode provided on a lower surface thereof,
        said plurality of LED array chips are aligned on said circuit board in a direction in which said light-emitting elements are aligned with equal intervals, and
        the entire lower surfaces of said plurality of LED array chips are electrically connected through the common electrodes provided thereon to said conductive pattern of the circuit board by a conductive epoxy resin-type adhesive that becomes flexible after curing, the conductive epoxy resin-type adhesive additionally physically attaching the LED array chips to the circuit board.

2. The LED array head according to claim 1, wherein said adhesive has a coefficient of elasticity less than 470 kg/mm².

3. The LED array head, comprising:
    a circuit board a base material of which forms a glass epoxy board having a conductive pattern formed thereon; and
    a plurality of LED array chips, including a compound semiconductor having gallium and arsenide therein,
    wherein each of said LED array chips has a plurality of light-emitting elements aligned and exposed on an upper surface thereof and has a common electrode provided on a lower surface thereof;
    wherein said plurality of LED array chips are aligned on said circuit board in a direction in which said light-emitting elements are aligned with equal intervals;
    wherein the common electrodes on the lower surfaces of said plurality of LED array chips are electrically connected to said conductive pattern of the circuit board by a conductive epoxy resin-type adhesive that becomes flexible after curing, the conductive epoxy resin-type adhesive additionally physically attaching the LED array chips to the circuit board;
    wherein each common electrode is connected to all of the plurality of light-emitting elements on the upper surface of the LED array chip having said each common electrode on the lower surface thereof;
    wherein said conductive pattern including bumps and dips in a surface thereof; and
    wherein the common electrodes are electrically connected to said conductive pattern through said epoxy resin-type adhesive, said epoxy resin-type adhesive having conductive particles therein.

4. The LED array head according to claim 3, wherein each of the bumps is sized to be shorter than each of the LED array chips and being positioned to be centered below a corresponding one of the LED array chips to provide support thereof.

5. The LED array head, comprising:
    a circuit board a base material of which forms a glass epoxy board having a conductive pattern formed thereon; and
    a plurality of LED array chips, including a compound semiconductor having gallium and arsenide therein,
    wherein each of said LED array chips has a plurality of light-emitting elements aligned and exposed on an upper surface thereof and has a common electrode provided on a lower surface thereof;
    wherein said plurality of LED array chips are aligned on said circuit board in a direction in which said light-emitting elements are aligned with equal intervals;
    wherein the common electrodes on the lower surfaces of said plurality of LED array chips are electrically connected to said conductive pattern of the circuit board by a conductive epoxy resin-type adhesive that becomes flexible after curing, the conductive epoxy resin-type adhesive additionally physically attaching the LED array chips to the circuit board;
    wherein each of the common electrodes is integral with the particular LED array chip having the lower surface on which the common electrode is provided, has bumps and dips thereon, and is connected to all of the light-emitting elements on the particular LED array chip, and
    wherein said common electrodes connected to said conductive pattern through said epoxy resin-type adhesive, said epoxy resin-type adhesive including conductive particles therein that make an electrical connection between said common electrodes and said conductive pattern.

6. The LED array head according to claim 5, wherein each of the bumps is sized to be shorter than each of the LED array chips and being positioned to be centered below a, corresponding one of the LED array chips to provide support thereof.

7. A circuit board a base material of which forms a glass epoxy board for carrying thereon a plurality of LED array chips on each of which an array of light-emitting elements and a common electrode are mounted so as to be aligned with equal intervals, the plurality of LED array chips to be aligned on the circuit board with equal intervals in an LED alignment direction in which the light-emitting elements are aligned, a center-to-center distance between endmost light-emitting elements of adjacent LED array chips to be substantially equal to a center-to-center distance between adjacent light-emitting elements on the adjacent LED array chips, the circuit board comprising:
    a conductive pattern; and
    bumps and dips formed on said conductive pattern and aligned in the LED alignment direction, each of the bumps sized to be shorter than each of the LED array chips and being positioned to be centered below a corresponding one of the LED array chips to provide support thereof.

8. An LED array chip for mounting on a conductive pattern formed on a circuit board a base material of which forms a glass epoxy board, each of the plurality of LED array chips comprising:

a plurality of light-emitting elements aligned with equal intervals on a front surface of said LED array chip; and a common electrode formed on a bottom surface of said LED array chip and connected to all of said plurality of light-emitting elements, said common electrode having bumps and dips formed thereon and being connected by an epoxy resin type soft adhesive having conductive particles therein directly to said conductive pattern, said conductive particles making electrical connection between said common electrode and said conductive pattern, wherein the plurality of LED array chips are aligned on the circuit board in a direction in which the light-emitting elements are aligned with equal intervals, and wherein a center-to-center distance between endmost light-emitting elements of adjacent LED array chips is equal to a center-to-center distance between adjacent light-emitting elements on the adjacent LED array chips.

* * * * *